United States Patent
Scian et al.

(10) Patent No.: US 6,194,948 B1
(45) Date of Patent: Feb. 27, 2001

(54) METHOD AND AN AUXILIARY CIRCUIT FOR PREVENTING THE TRIGGERING OF A PARASITIC TRANSISTOR IN AN OUTPUT STAGE OF AN ELECTRONIC CIRCUIT

(75) Inventors: Enrico Scian, Cordenons; Fabrizio Martignoni, Morazzone; Riccardo Depetro, Domodossola, all of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/106,583

(22) Filed: Jun. 29, 1998

(30) Foreign Application Priority Data

Jun. 30, 1997 (EP) .................................. 97830327

(51) Int. Cl.[7] .................................................. H03K 17/30
(52) U.S. Cl. ........................... 327/382; 327/390; 327/534; 326/27
(58) Field of Search .................................. 327/379–382, 327/384, 386, 389, 390, 391, 530, 534; 257/372; 326/26–28

(56) References Cited

U.S. PATENT DOCUMENTS

| 5,422,591 | 6/1995 | Rastegar et al. ................. 327/409 |
| 5,576,635 | 11/1996 | Partovi et al. ..................... 326/27 |
| 5,838,047 | * 11/1998 | Yamauchi et al. ............... 257/372 |

FOREIGN PATENT DOCUMENTS 0 346 898 A2   12/1989   (EP) ........................... H03K/17/693

* cited by examiner

*Primary Examiner*—Timothy P. Callahan
*Assistant Examiner*—Minh Nguyen
(74) *Attorney, Agent, or Firm*—Theodore E. Galanthay; E. Russell Tarleton; Seed IP Law Group PLLC

(57) ABSTRACT

A method, and related circuit, prevent the triggering of a parasitic transistor in an output stage of an electronic circuit. The stage includes a transistor pair with at least one transistor of the pull-up PMOS type having respective source, gate and drain terminals and a body terminal, and a parasitic bipolar transistor having a terminal connected to the body terminal. The method includes the steps of providing a capacitor connected between the body and source terminals of the PMOS transistor; and using a control circuit to suppress the body effect of the pull-up PMOS transistor.

14 Claims, 5 Drawing Sheets

METHOD AND AN AUXILIARY CIRCUIT FOR PREVENTING THE TRIGGERING OF A PARASITIC TRANSISTOR IN AN OUTPUT STAGE OF AN ELECTRONIC CIRCUIT

TECHNICAL FIELD

This invention relates to a method and related auxiliary circuit for preventing the triggering of a parasitic transistor in an output stage of an electronic circuit.

BACKGROUND OF THE INVENTION

As is well known, a final output stage of a generic electronic circuit, of any degree of complexity, basically comprises a driver portion or stage arranged to deliver electric power to a load. Therefore, the stage must be capable of draining or drawing current from the load according to necessity and the type of application.

Countless configurations have been devised for state-of-art output stages. Shown schematically in the accompanying FIG. 1 is one of the most common output stage configurations.

The output stage of FIG. 1 comprises a complementary pair of MOS transistors connected in series between a first voltage reference Vdd and a second voltage reference Vss, wherein the latter may be a negative supply or ground.

The first transistor M1 in the complementary pair is a pull-down transistor of either the NMOS or the DMOS type, and has its body terminal connected to the source terminal.

The second transistor M2 in the complementary pair is a pull-up transistor of the PMOS type, and has its body terminal connected to the source terminal.

Respective driving stages have respective outputs connected to the gate terminals of the transistors M1 and M2.

The two transistors, M1 and M2, are connected together by their drain terminals, which are coincident with an output node OUT. An electric load LOAD is connected between the output node OUT and a ground.

The load LOAD is driven alternatively by the PMOS transistor M2 or the NMOS transistor M1, depending on the different sourcing or sinking operational steps.

The complementary pairs of MOS transistors are those most widely used for implementing output stages on account of the clear advantages that they can offer as concerns the control logics. However, the considerations made hereinafter can also apply to output stage configurations which incorporate bipolar transistors or other pairs of MOS transistors.

FIG. 2 shows, for example, an output stage incorporating a pair of transistors which are both of either the NMOS or the DMOS type. These transistors M3, M4 are connected together at the output node OUT.

Some applications require that the current be looped back from the load to the positive and/or negative supplies. This is necessary, for instance, in the field of flat panels, where a high voltage pulser generates a pulsed supply.

FIG. 4 shows schematically an embodiment wherein two, respectively positive and negative pulsers supplying respective voltage references are associated with the circuit of FIG. 1.

During the rising edge of the supply signal, energy is delivered to the load, whereas during the signal falling edge, the load returns part of its energy to the supply line. FIG. 3 shows schematically the scalene trapezoid pattern of the supply voltage during the periods when such energy transfers occur.

The current loop-back is allowed by the bi-directional operability of the components employed, namely the PMOS, NMOS or DMOS transistors.

However, each MOS component has a parasitic diode associated therewith which affects operation in the reverse range.

As to the PMOS transistor, also present beside the parasitic diode formed by the drain-body p-n junction is a parasitic bipolar transistor of the vertical pnp type which is formed by the drain-body-substrate junctions.

Unfortunately, this parasitic bipolar transistor is also active during the operation of its associated MOS transistor, and instead of contributing to the current loop-back, will contribute to dissipating the current flowing through it to the substrate.

The above situation, additionally to being unfavorable from the viewpoint of energy recovery, may harm the output stage because the substrate potential can rise locally to the point of triggering more parasitic elements.

Thus, it becomes necessary to limit the gain of the parasitic transistor, e.g., by keeping its beta coefficient low using suitable techniques. Another solution could be that of "freezing" the areas around the PMOS transistor by means of appropriate substrate taps.

Other, more radical solutions provide for the use of SOI or dielectric insulation technologies.

SUMMARY OF THE INVENTION

According to principles of the present invention, a method and related circuit are provided which have such functional and structural features as to prevent the triggering of parasitic transistors during the driving of an output stage, and more particularly to prevent activation of the drain-body diode, or at least reduce substantially the current carried thereby.

According to an embodiment of the present invention, a method for preventing the triggering of a parasitic transistor in an output stage of an electronic circuit is provided, the stage comprising a transistor pair with at least one transistor of the PMOS pull-up type having respective source, gate and drain terminals and a body terminal, and a parasitic bipolar transistor having a terminal connected to said body terminal.

According to the embodiment of the present invention, the body terminal of the PMOS transistor in the complementary pair that forms the output stage is disconnected from the source terminal, and connecting it to a "pull-up" capacitor connected between the body and source terminals.

The features and advantages of the method and the circuit of the embodiment of the present invention will be apparent from the following description, given by way of non-limitative example with reference to the accompanying drawings.

DETAILED DESCRIPTION OF THE INVENTION

Figure 5:
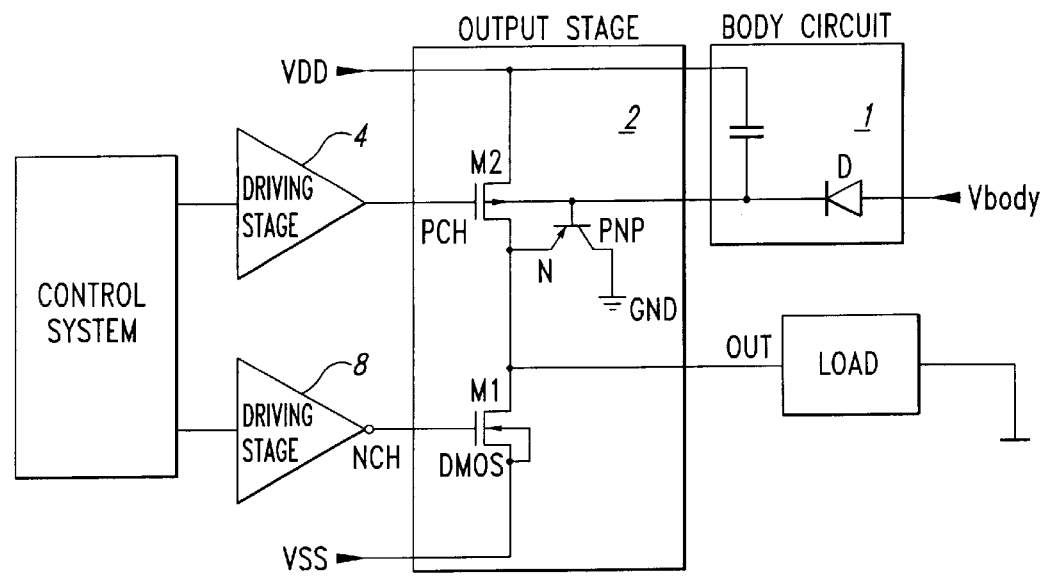
FIG. 5 is a schematic view of an auxiliary circuit according to an embodiment of the present invention.

Referring to the drawings, in particular to the example in FIG. 5, generally and schematically shown at 1 is an auxiliary or body circuit according to an embodiment of the present invention, for a final output stage 2 of an electronic control circuit.

The stage 2 is adapted to drive an electric load LOAD connected between an output node OUT of the stage 2 and a ground.

Figure 1:
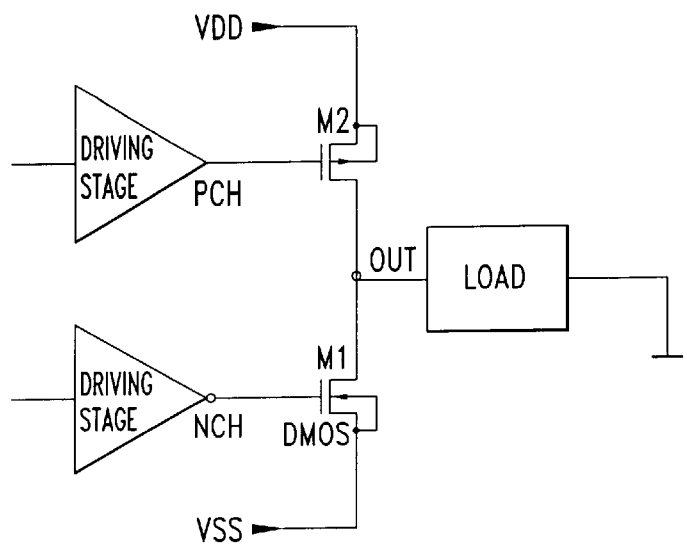
FIGS. 1, 2 and 4 are respective schematic views of final output stages according to the prior art.
Figure 2:
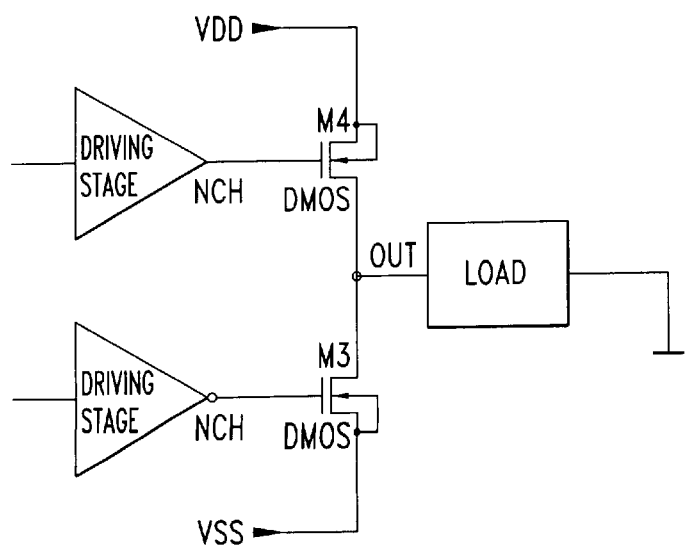
Figure 3:
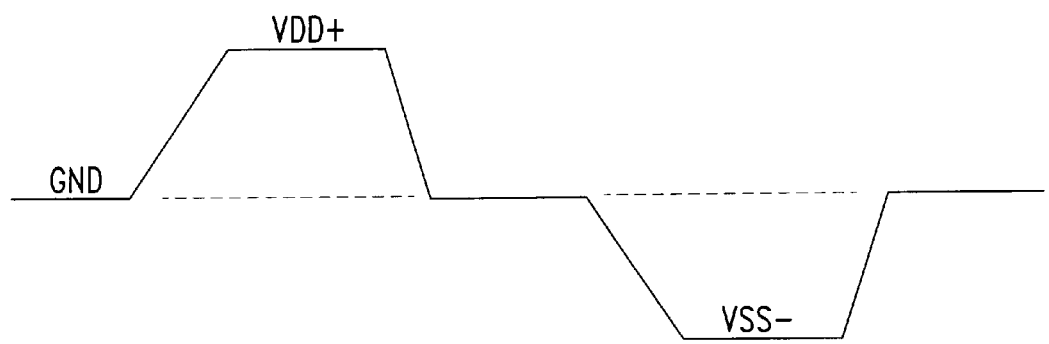
FIG. 3 shows a waveform of a signal present within the stage of FIG. 2.
Figure 4:
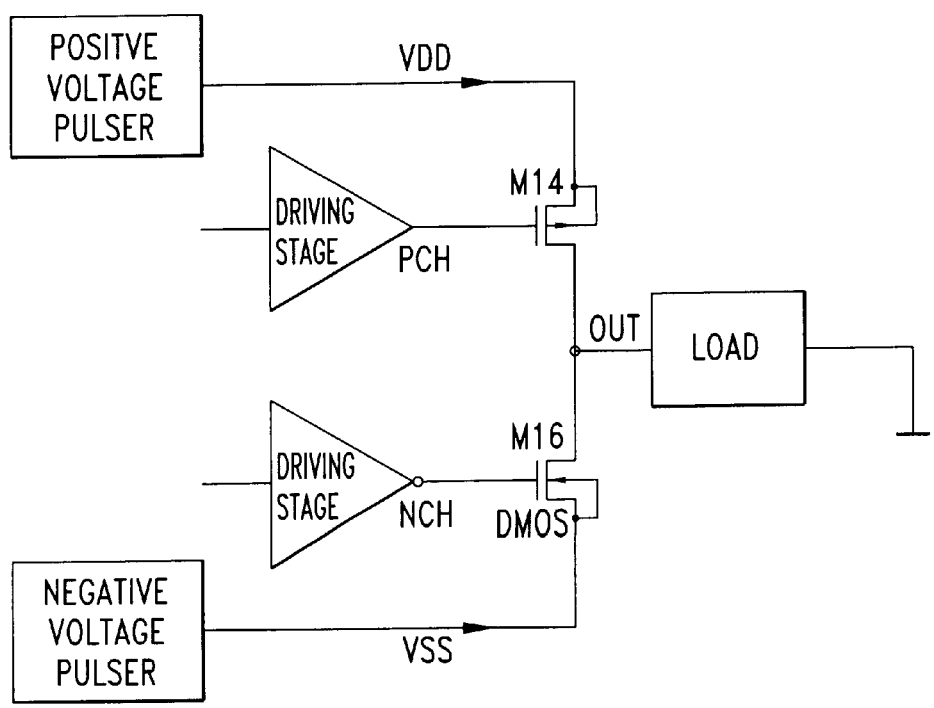

The stage 2 preferably comprises a complementary pair of MOS transistors, M1 and M2, which are substantially identical with those discussed above with reference to FIG. 1. Accordingly, no detailed description of the transistors M1 and M2 will be given hereinafter and reference will be made to the description of FIG. 1 given hereinabove.

In particular, attention is drawn on that schematically shown at 3 in FIG. 5 is the parasitic bipolar transistor associated with the PMOS transistor M2 in the complementary pair of the stage 2.

This transistor 3 of the pnp type has its emitter terminal connected to the drain terminals of the complementary pair, base terminal connected to the body terminal of the PMOS transistor M2, and collector terminal connected to ground GND.

The auxiliary circuit 1 is connected to the stage 2, and comprises a capacitor C1 connected between the body and source terminals of the PMOS transistor M2 in the complementary pair incorporated to the stage 2.

The circuit 1 further comprises a diode DJ connected with one end to the body terminal of the transistor M2, and hence to the base terminal of the parasitic transistor 3. The diode DJ has the other end free to receive a voltage signal denoted by Vbody.

Advantageously in this invention, the construction of the circuit 1 leaves the body terminal of the PMOS transistor M2 substantially disconnected from the source terminal. This body terminal is led to the "pull-up" capacitor C1, which is connected between the body and source terminals of the transistor M2.

This capacitor C1 is precharged, that is, charged before the pulse, through the diode DJ whenever the high voltage supply happens to be low.

In fact, the diode DJ is connected between one end of the capacitor C1 and a DC potential line at a low voltage Vbody of predetermined value.

As the pulsive supply rises, the body terminal of the transistor M2 is also brought up to maintain a permanent body effect on the PMOS transistor. This effect may be regarded as disadvantageous, but can be accommodated by a higher driving overvoltage; that is, by an appropriate drop in the voltage Vgate-source across the gate and source terminals.

On the falling edge of the pulsive signal, the voltage at the drain terminal of the PMOS transistor M2, can be held below the voltage at the body terminal by suitably dimensioning the PMOS transistor M2 and applying a preselected suitable voltage Vbody. In this way, the junction would not become activated, or draw any significant amount of current if somehow turned on.

The auxiliary circuit of this invention, while preventing the triggering of parasitic transistors, has the disadvantage of imposing a body effect on the PMOS transistor during the rising edge of the supply signal.

This raises the threshold voltage (Vth) of the PMOS transistor, and lacking the boosting feature, would require that the PMOS transistor be over-designed to supply the same current.

To obviate this drawback, a body control circuit 5 has been introduced for shorting the body terminal of the transistor M2 to the source terminal thereof during the rising edge. This suppresses the body effect.

Figure 6:
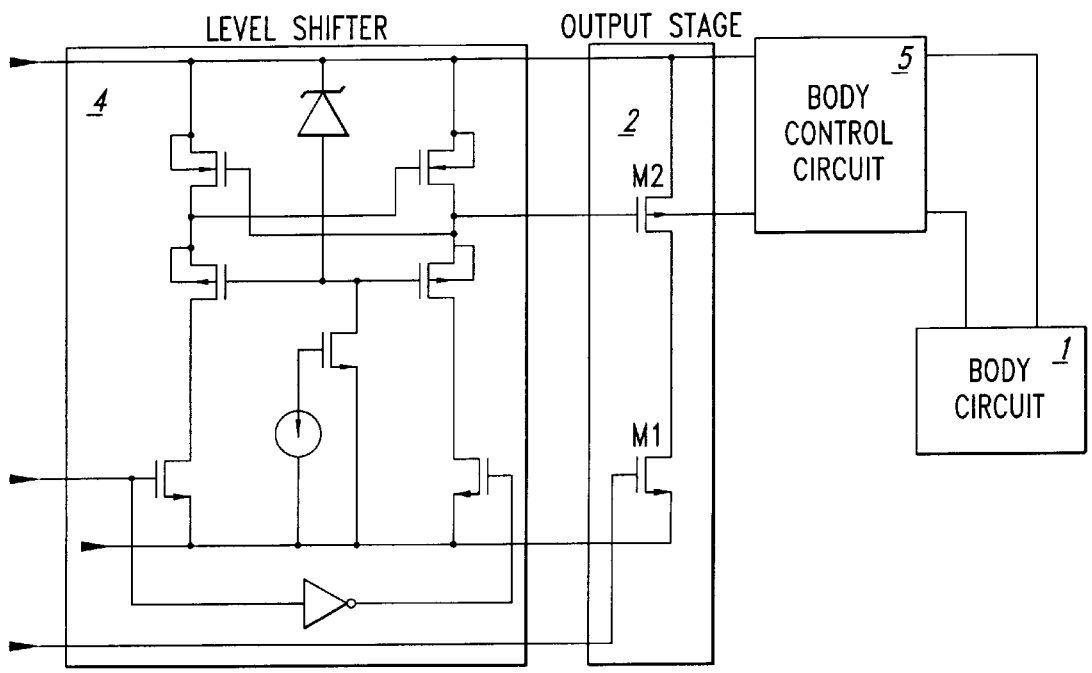
FIG. 6 is a schematic detail view of the auxiliary circuit shown in FIG. 5 according to another embodiment of the present invention.

FIG. 6 shows schematically the general layout of the interconnections between the stage 2 and driving and control circuitry according to another embodiment of the present invention.

A level shifter and driving stage 4 has at least one output connected to the control terminal of the transistor M2 in the stage 2. The body circuit 1 has an output coupled to the body terminal of the transistor M2, and the body control circuit 5 has an output connected to the body circuit 1. In FIG. 5, the stage 4 is shown duplicated in a stage 8 for driving the transistor M1.

Figure 7:
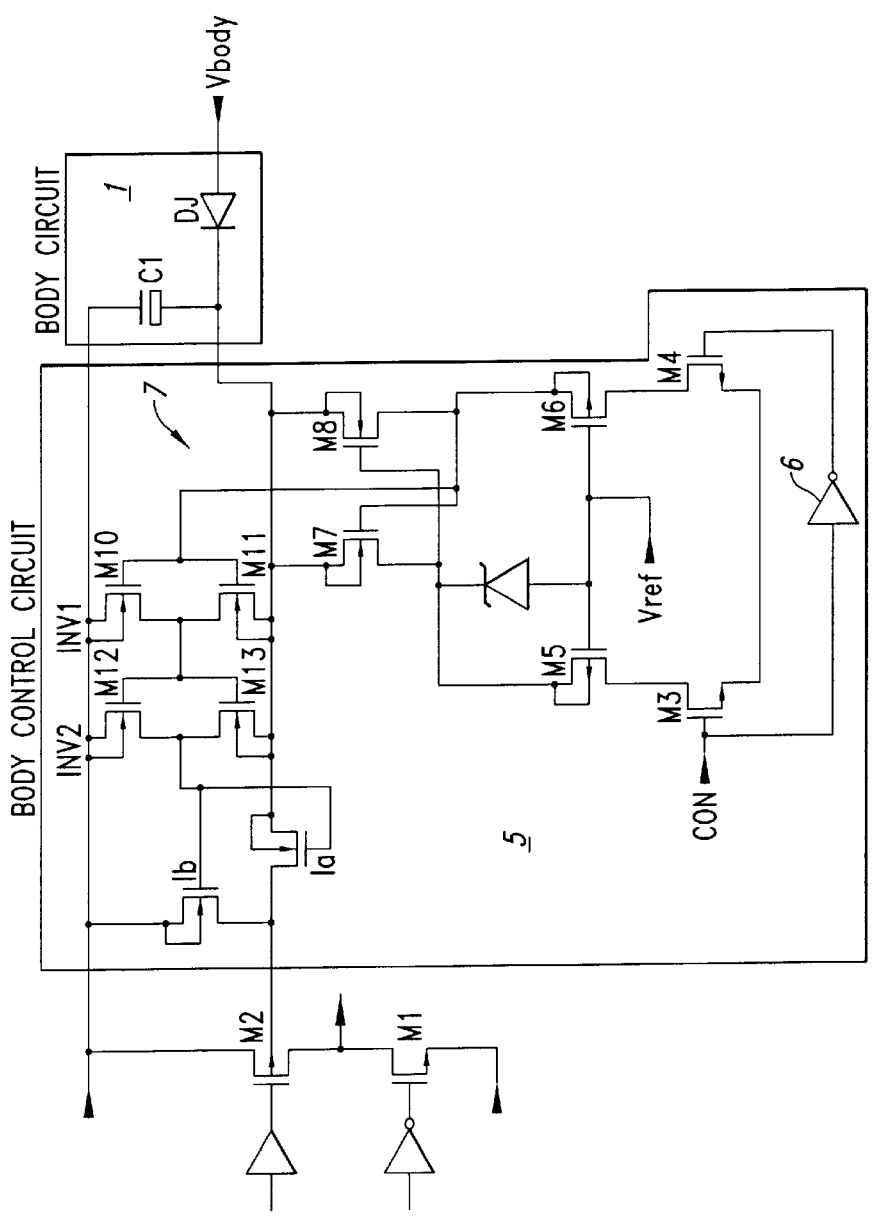
FIG. 7 is a detailed circuit diagram of a portion of the circuit shown in FIG. 6.

FIG. 7 shows in greater detail the internal construction of the body control circuit 5. The shifter stage 4 holds M1 off and M2 on throughout the period of the positive supply pulse Vdd.

The circuit stage 4 can be classed substantially as a high voltage level shifter transferring logic information to the two MOS switches, M1 and M2.

The body control circuit 5 comprises a differential cell level shifter which includes a pair of input DMOS transistors, M3 and M4. An input signal CON is applied directly to the transistor M3, and in inverted form through an inverter 6 to the transistor M4.

The differential cell of the circuit 5 has on its output a pair of NMOS transistors M5, M6 whose gate terminals are connected together and to a voltage reference Vref These transistors are voltage-effective and can ensure shifting of the signal from a relatively low voltage V5 to a higher voltage related to Vdd+Vbody.

In addition, a further pair of transistors M7, M8 are connected to form a flip-flop storage element 7, with the control terminal of the transistor M7 being connected to the drain terminal of the transistor M8, and vice versa. This storage element is effective to store On/Off information.

The On/Off information is also passed to two switches Ia and Ib operated in phase opposition, that is one of them will be open when the other is closed.

The connection between the storage element 7 and the switches Ia and Ib is established through two inverters INV1 and INV2, each comprising a transistor pair. MOS transistors M10 and M11 are provided in the inverter INV1, and MOS transistors M12 and M13 in the inverter INV2.

The inverters INV1 and INV2 are cascade connected and biased by the voltage across the pull-up capacitor C1 of the body circuit 1.

During the rising edge of the supply signal Vdd, the switch Ib is in the on state and shorts together the body and source terminals of the transistor M2.

During the falling edge of the supply signal Vdd, the switch Ia is in the on state and the body terminal of the transistor M2 is connected to the positive potential terminal of the pull-up capacitor C1. Thus, the body terminal is biased to a voltage equal to the voltage drop across the previously charged capacitor C1, and the body circuit 1 is allowed to perform its function of preventing the triggering of the parasitic transistor in the manner described above.

The arrangement just described represents but one exemplary application, it being non-limitative as concerns the operation of this invention.

A noteworthy advantage of this invention is that in multiple output driving circuits, such as those used for flat panels where plural output stages are utilized as drivers for rows and columns of cell arrays having 40 or 64 outputs, for example, the body terminal locates in a common well to all of the PMOS transistors in the output stages. In this way, a single control circuit 5 can be used for the whole integrated circuit incorporating the plurality of stages.

Figure 8:
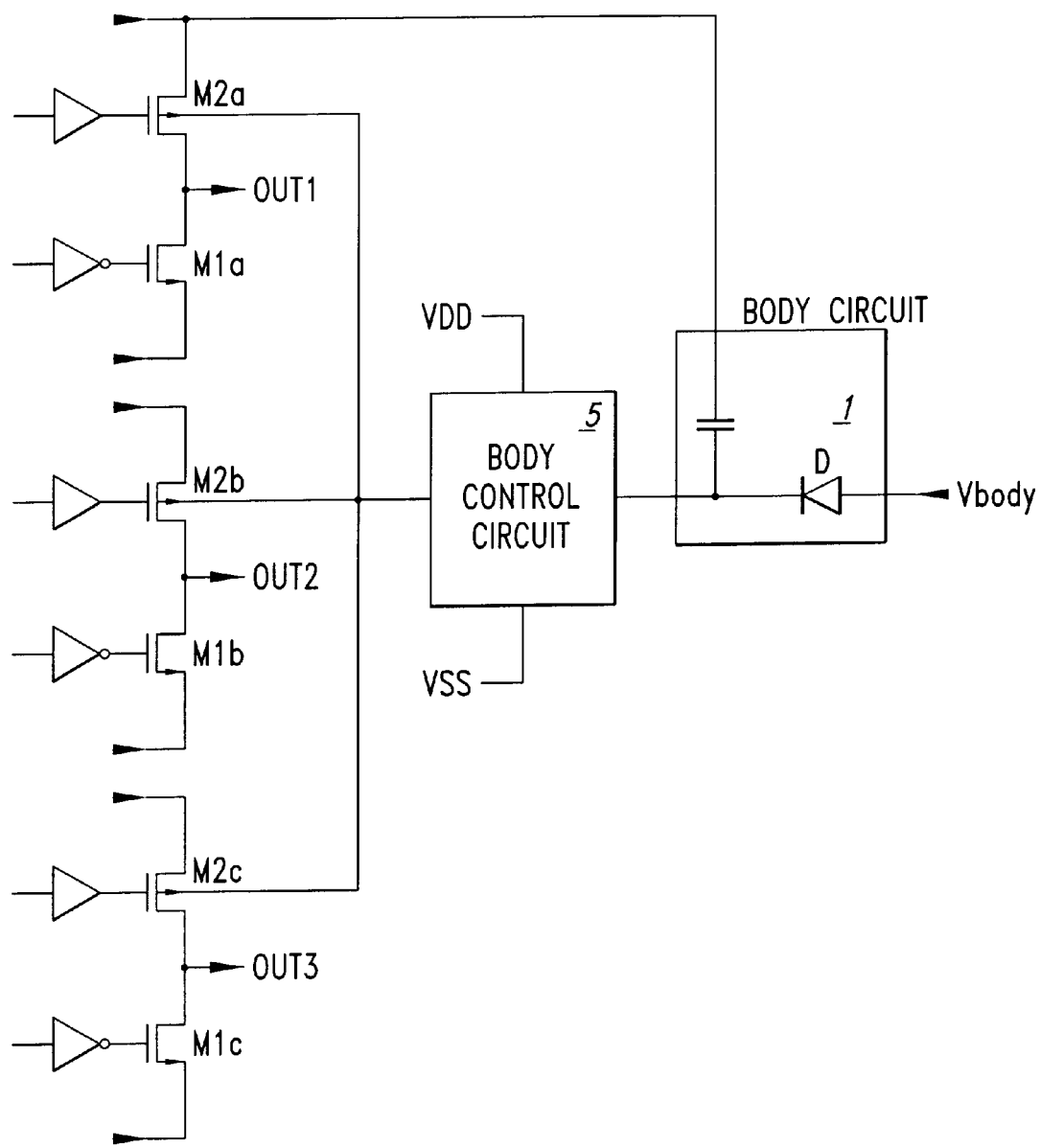
FIG. 8 shows an exemplary application of the invention to a plurality of output stages according to another embodiment of the present invention.

FIG. 8 illustrates schematically this possible situation where plural output stages, three stages in the example, are arranged in parallel with one another, connected to a single pull-up capacitor C1, and employ a single control circuit 5 according to another embodiment of the present invention.

The capacitor C1 could even be shared by a number of integrated circuits. Similar considerations would also apply to the diode DJ, which can be of either the integrated or the discrete type for charging the capacitor C1.

This capacitor C1 should be designed to deliver a sufficient charge to all the wells connected thereto, where the latter must be charged during the supply pulse.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for preventing triggering of a parasitic transistor in an output stage of an electronic circuit, the method comprising the steps of:
   providing a capacitor connected between the body and source terminals of a pull-up PMOS transistor in the output stage;
   using a control circuit to suppress the body effect of the PMOS transistor by controlling a switch coupled between the body terminal and the source terminal of the PMOS transistor to couple the body terminal to the source terminal during a rising edge of each supply voltage pulse; and
   further comprising coupling one end of a diode to the body terminal of the PMOS transistor and having the other end free to receive a voltage potential to said body terminal.

2. A method according to claim 1, further comprising providing in said control circuit a level shifter associated with a storage element and connected to a pair of switches operated in phase opposition.

3. The method according to claim 1, further comprising providing said control circuit with at least one output connected to drive the gate terminal of said PMOS transistor with at least one output signal from the control circuit.

4. An auxiliary circuit for preventing a triggering of a parasitic transistor in an output stage of an electronic circuit, the output stage having a transistor pair with at least one transistor of a pull-up PMOS type having respective source, gate and drain terminals and a body terminal, the auxiliary circuit comprising:
   a diode having one end connected to the body terminal of the PMOS transistor, and the other end free to receive a voltage potential; and
   a capacitor connected between the body and source terminals of the PMOS transistor, and a control circuit for suppressing the body effect of the PMOS transistor, the control circuit comprising at least one switch coupled between the body and source terminals of the PMOS transistor and configured to couple the body terminal to the source terminal during a rising edge of a supply voltage pulse.

5. An auxiliary circuit according to claim 4, wherein the control circuit further comprises a level shifter associated with a storage element, the control circuit connected to a pair of switches operated in phase opposition.

6. An auxiliary circuit according to claim 5 wherein said storage element associated with the control circuit comprises a MOS transistor flip-flop.

7. A circuit for preventing triggering of a parasitic element the circuit comprising:
   a capacitor coupled between a body terminal and a first terminal of a first transistor in an output stage;
   a first voltage source coupled to the capacitor and the body terminal, the first voltage source comprises a controllable voltage source structured to provide a first voltage to the body terminal of the first transistor that exceeds a voltage at a second terminal of the first transistor during the falling edges of supply voltage pulses; from a second voltage source
   a switch coupled between the body terminal and the first terminal of the first transistor and configured to couple the body terminal to the first terminal on the rising edges each of the supply voltage pulses, and the first terminal of the first transistor is coupled to the second voltage source structured to provide the supply voltage pulses to the first terminal of the first transistor, and a second terminal of the first transistor is coupled to a load; and
   a diode coupled between the body terminal and the first voltage source.

8. A circuit according to claim 7 wherein the output stage further comprises:
   an NMOS pull-down transistor having a body terminal connected to a source terminal and a third voltage source, and a drain terminal coupled to the load; and
   the first transistor comprises a PMOS pull-up transistor having the body terminal comprising a first portion of the parasitic element, a source terminal connected to the second voltage source, and a drain terminal coupled to the load.

9. A circuit according to claim 7, further comprising a second switch coupled between the body terminal, the capacitor, and the first voltage source, the second switch being structured to be rendered conductive during the falling edges of the supply voltage pulses to couple the body terminal to the capacitor and the first voltage source.

10. A method for preventing triggering of a parasitic transistor, the method comprising:
    providing a capacitor connected between a body terminal and a source terminal of a pull-up PMOS transistor in an output stage of an electronic circuit; and
    using a control circuit to suppress the body effect of the pull-up PMOS transistor, including providing in the control circuit a level shifter associated with a storage element and connected to a pair of switches operated in phase opposition.

11. The method of claim 10, further comprising providing the control circuit with at least one output connected to drive the gate terminal of the PMOS transistor with at least one output signal from the control circuit.

12. A circuit for preventing triggering of a parasitic element, the circuit comprising:

a capacitor coupled between a body terminal and a first terminal of a pull-up PMOS transistor in an output stage of an electronic circuit;

a first voltage source coupled to the capacitor and the body terminal, the first voltage source comprising a controllable voltage source structured to provide a first voltage to the body terminal of the PMOS transistor that exceeds a voltage at a second terminal of the PMOS transistor during the falling edges of supply voltage pulses from a second voltage source;

the second voltage source coupled to the first terminal of the PMOS transistor and structured to provide the supply voltage pulses to the first terminal of the PMOS transistor and a second terminal of the PMOS transistor;

a diode coupled between the body terminal of the PMOS transistor and the first voltage source; and an NMOS pull-down transistor in the output stage having a body terminal connected to a source terminal and a third voltage source, and a drain terminal coupled to the load.

13. The circuit of claim 12, further comprising a first switch coupled between the body terminal and the first terminal of the PMOS transistor and parallel with the capacitor, the first switch being structured to be rendered conductive to couple the body terminal to the first terminal during the rising edges of the supply voltage pulses.

14. A method for preventing triggering of a parasitic transistor, the method comprising:

providing a capacitor connected between the body and source terminals of a pull-up PMOS transistor in an output stage of an electronic circuit, the PMOS transistor having source, gate and drain terminals and a body terminal; and providing a control circuit having a level shifter associated with a storage element and connected to a pair of switches in phase opposition, the control circuit controlling the switches coupled between the body terminal and the source terminal of the PMOS transistor to couple the body terminal to the source terminal during a rising edge of each supply voltage pulse.

\* \* \* \* \*